(12) United States Patent
Hori et al.

(10) Patent No.: US 8,082,128 B2
(45) Date of Patent: Dec. 20, 2011

(54) BUILDING MATERIAL DESIGN SUPPORT SYSTEM, BUILDING MATERIAL, AND PROGRAM FOR THE SYSTEM

(75) Inventors: Shingo Hori, Nagoya (JP); Hiroyuki Yamauchi, Nagoya (JP); Tomoyoshi Yabe, Nagoya (JP)

(73) Assignee: Nichiha Co., Ltd, Nagoya-shi (JP)

( * ) Notice: Subject to any disclaimer, the term of this patent is extended or adjusted under 35 U.S.C. 154(b) by 1058 days.

(21) Appl. No.: 11/358,742

(22) Filed: Feb. 22, 2006

(65) Prior Publication Data

US 2006/0204721 A1    Sep. 14, 2006

(30) Foreign Application Priority Data

Feb. 23, 2005 (JP) ................... 2005-046712

(51) Int. Cl.
*G06F 17/50* (2006.01)
(52) U.S. Cl. ............................................. 703/1
(58) Field of Classification Search .................. None
See application file for complete search history.

(56) References Cited

U.S. PATENT DOCUMENTS

| 5,847,712 A * | 12/1998 | Salesin et al. | 345/582 |
| 2004/0061700 A1 * | 4/2004 | Shioya | 345/426 |

FOREIGN PATENT DOCUMENTS

| JP | 11-338899 | 12/1999 |
| JP | 2000-67100 | 3/2000 |
| JP | 2000-132577 | 5/2000 |

OTHER PUBLICATIONS

"EYE Candy 5 Manual" Published by Alien Skin Software, 1111 Haynes Street, Suite 113 Raleigh, NC 27604, Copyright 2004, 52 pages.*

* cited by examiner

*Primary Examiner* — Dwin M Craig
(74) *Attorney, Agent, or Firm* — Edwards Wildman Palmer LLP

(57) ABSTRACT

The present invention relates to a building material design support system for supporting design of a building material capable of exhibiting a random texture pattern as a whole in a state in which the building materials are installed on a building portion and exhibiting continuity of the texture of adjacent building materials, such building material and a program for use in such building material design support system. More specifically, on a building material, first convex portions #A1L, #A1R, #A2L, #A2R to be arranged next to corresponding first convex portions of an adjacent building material have a prescribed texture common to every building materials, and the second convex portions have randomly arranged textures different from each other on every building material.

1 Claim, 13 Drawing Sheets

SURFACE DESIGN PATTERN

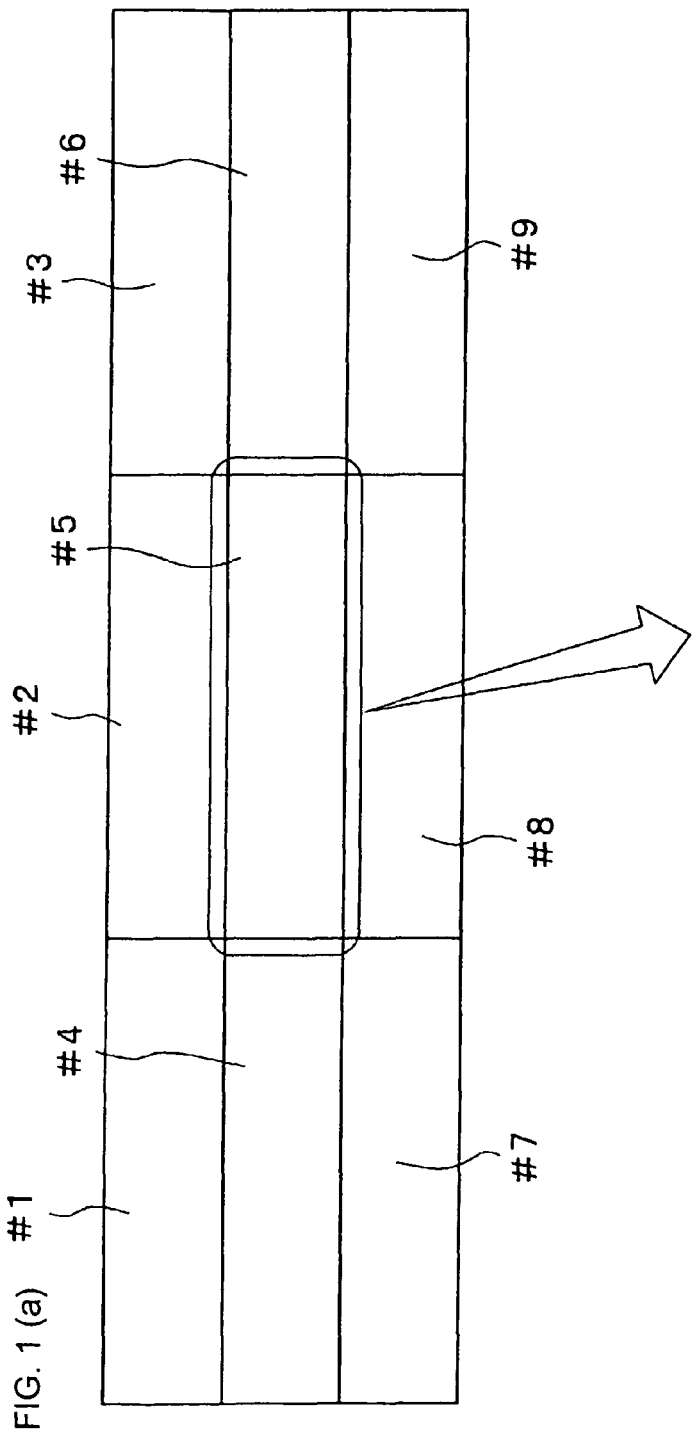
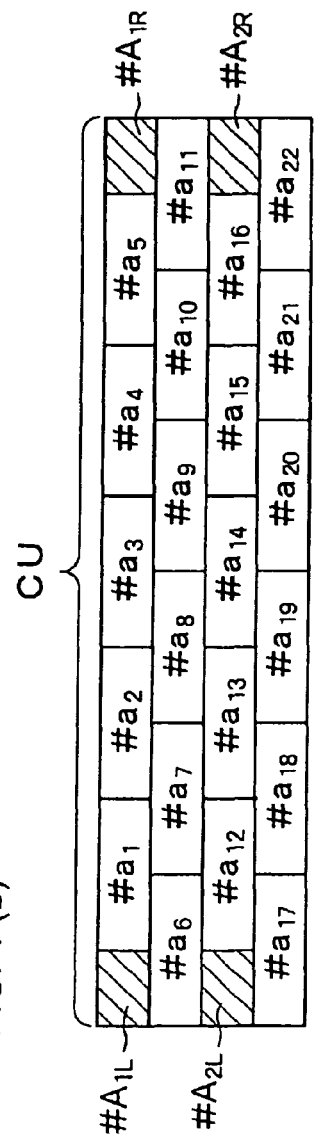
FIG. 1(a)
FIG. 1(b)

FIG. 4  SURFACE DESIGN PATTERN

BUILDING MATERIAL DESIGN SUPPORT SYSTEM, BUILDING MATERIAL, AND PROGRAM FOR THE SYSTEM

This application claims priority under 35 U.S.C. §119 to Japanese Patent Application No. 2005-046712 filed on Feb. 23, 2005, the entire disclosure of which is incorporated herein by reference in its entirety.

BACKGROUND OF THE INVENTION

1. Field of the Invention

The present invention relates to a building material design support system for supporting the design of a building material such as an exterior panel or a roof material to be installed on a building exterior portion or a roof portion, a building material and a program for use in such building material design support system. More specifically, the present invention relates to a building material design support system for supporting design of a building material capable of exhibiting a random texture pattern as a whole in a state in which the building materials are installed on a building portion and exhibiting continuity of the texture of adjacent building materials, such building material and a program for use in such building material design support system.

2. Description of the Related Art

The following description sets forth the inventor's knowledge of related art and problems therein and should not be construed as an admission of knowledge of the prior art.

As a conventional house coordinate support system for simulating a building exterior appearance, the following system is known (e.g. Japanese Patent Nos. 3,002,666, and 3,002,670). In the system, several building exterior appearance patterns and several building material exterior appearance patterns are prepared in advance. Then, a certain building exterior appearance, i.e., an exterior appearance of a constructed building exterior portion or roof portion, is simulated on a monitor screen by applying several building material exterior patterns selected from the prepared building material exterior patterns to a certain building exterior appearance pattern displayed on the monitor screen.

The aforementioned building material exterior patterns of exterior panels and/or roof materials to be applied to the building exterior appearance pattern are flat image data of respective goods selected from existing available goods. Such image data is subjected to image data processing such as enlargement, reduction and/or rotation processing, and then pasted on a prescribed building exterior pattern. As a concrete exterior pattern of the building material, for example, a single flat image data, in which a surface design pattern showing the dividing status of convex portions and concave portions, a texture showing the feel of the material of the convex portion, the color information, etc., are integrated, is used. The flat image data to be used for the pasting is a fixed data.

In another building material design support system for supporting the design of a building material itself such as an exterior panel or a roof material (e.g., Japanese Patent No. 3,023,352), using a monitor, exterior patterns of building materials to be used are designed on a screen of the monitor. In this system, a concept in which a surface design pattern and the texture are integrated is treated as a texture, and the color information can be changed. Therefore, even in cases where the same texture is used with respect to a certain surface design pattern, various different exterior patterns can be designed. That is, this flat image data to be pasted is a variable data to which prescribed color information is added.

For example, in a conventional building material with a brick-piled-like surface design, since each building material has the same texture arrangement, the entire exterior appearance of the building materials after the construction looks monotonous due to the repetition of the pattern. In view of the above, for the purpose of creating a natural texture, it can be considered to randomly create building materials different in texture arrangement. In this case, however, the textures of adjacent building materials discontinue at the joint portions, resulting in an unnatural appearance.

The description herein of advantages and disadvantages of various features, embodiments, methods, and apparatus disclosed in other publications is in no way intended to limit the present invention. For example, certain features of the preferred embodiments of the invention may be capable of overcoming certain disadvantages and/or providing certain advantages, such as, e.g., disadvantages and/or advantages discussed herein, while retaining some or all of the features, embodiments, methods, and apparatus disclosed therein.

SUMMARY OF THE INVENTION

The preferred embodiments of the present invention have been developed in view of the above-mentioned and/or other problems in the related art. The preferred embodiments of the present invention can significantly improve upon existing methods and/or apparatuses.

Among other potential advantages, some embodiments can provide a building material having a surface design pattern which exhibits an appearance of a random texture pattern arrangement as a whole and also exhibits continuity of the textures of adjacent building materials after installing on a building exterior portion.

Among other potential advantages, some embodiments can provide a building material design support system for designing such building material.

Among other potential advantages, some embodiments can provide a program for use in such building material design support system.

According to some embodiments of the present invention, a building material design support system for supporting design of a surface pattern of a building material including island-shaped convex portions and concave portions connecting the adjacent convex portions, the convex portions including first convex portions to be arranged next to corresponding first convex portions of the adjacent building material and second convex portions each surrounded by the concave portions, the building material design support system including:

a surface design pattern data file configured to store surface design pattern data on arrangements of the convex portions and the concave portions;

a texture pattern data file configured to store texture pattern groups including plural texture patterns of the same system, the texture pattern representing the feel of a material of the convex portion;

a surface design pattern selection means for selectively reading out one of the surface design pattern data stored in the surface design pattern data file;

a texture pattern group selection means for selectively reading out one of the texture pattern groups stored in the texture pattern data file;

an image composition means for allotting a prescribed texture pattern common to all of building materials among a texture pattern group selectively read out with the texture pattern group selection means to the first convex portions of the surface design pattern selectively read out with the surface design pattern selection means and for randomly allotting texture patterns from the texture pattern group to the second convex portions; and a display means for displaying a surface design to which the texture patterns are allotted to the surface design pattern by the image composition means.

According to some embodiments of the present invention, a plurality of building materials including island-shaped convex portions and concave portions connecting the adjacent convex portions, the convex portions including first convex portions to be arranged next to the corresponding first convex portions of the adjacent building material and second convex portions each surrounded by the concave portions, wherein the first convex portions have a common texture among all of the plurality of building materials, and wherein the second convex portions have randomly arranged textures different on every building material.

According to some embodiments of the present invention, a program for making a computer function as a building material design support system for supporting design of a surface pattern of a building material including island-shaped convex portions and concave portions connecting the adjacent convex portions, the convex portions including first convex portions to be arranged next to corresponding first convex portions of the adjacent building material and second convex portions each surrounded by the concave portions, wherein the building material design support system includes:

a surface design pattern data file configured to store surface design pattern data on arrangements of the convex portions and the concave portions;

a texture pattern data file configured to store texture pattern groups including plural texture patterns of the same system, the texture pattern representing the feel of a material of the convex portion;

a surface design pattern selection means for selectively reading out one of the surface design pattern data stored in the surface design pattern data file;

a texture pattern group selection means for selectively reading out one of the texture pattern groups stored in the texture pattern data file;

an image composition means for allotting a prescribed texture pattern common to all of building materials among a texture pattern group selectively read out with the texture pattern group selection means to the first convex portions of the surface design pattern selectively read out with the surface design pattern selection means and for randomly allotting texture patterns from the texture pattern group to the second convex portions; and a display means for displaying a surface design to which the texture patterns are allotted to the surface design pattern by the image composition means.

EFFECTS OF THE INVENTION

According to some embodiments of the present invention, the surface design patterns of the building materials installed on a building exterior portion appear like a random texture pattern arrangement as a whole and exhibit a continuity of textures of adjacent building materials.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/or advantages of particular embodiments should not be construed as limiting other embodiments or the claims.

BRIEF DESCRIPTION OF THE DRAWINGS

The preferred embodiments of the present invention are shown by way of example, and not limitation, in the accompanying figures, in which:

FIG. 1A is an explanatory view showing an example of an exterior appearance of arranged exterior panels designed with a building material design support system according to an embodiment of the present invention;

FIG. 1B is an explanatory view showing one of the exterior panels shown in FIG. 1A;

DETAILED DESCRIPTION OF THE PREFERRED EMBODIMENTS

Figure 2:
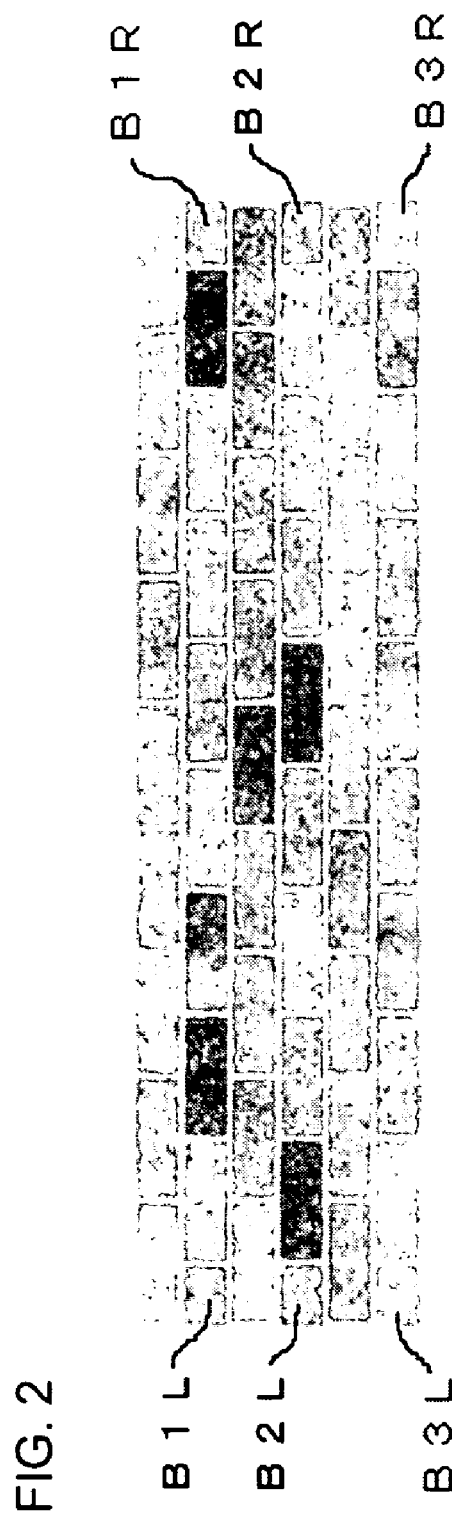
FIG. 2 is an example of a single exterior panel designed with a building material design support system according to an embodiment of the present invention.

In the following paragraphs, some preferred embodiments of the invention will be described with reference to the attached drawings by way of example and not limitation. It should be understood based on this disclosure that various other modifications can be made by those in the art based on these illustrated embodiments.

FIG. 1 shows an example of an exterior appearance of exterior panels designed with a building material design support system according to an embodiment of the present invention. FIG. 1A shows an arrangement of exterior panels in which elongated exterior panels #1 to #9 are arranged in three rows with three columns so that an assumed exterior appearance of the exterior portion can be considered in advance. This enables a user to review the pattern connecting status of the adjacent exterior panels. FIG. 1B is an explanatory view to be used for explaining the detail of one of the exterior panels shown in FIG. 1A.

A surface design pattern unit CU as an exterior panel unit has a brick-piled-like surface design consisting of island-shaped convex portions and concave portions connecting the adjacent convex portions. The convex portions include first convex portions #A1L, #A1R, #A2L, #A2R to be arranged next to corresponding first convex portions of the adjacent exterior panel and second convex portions #a1 to #a22 located inside of #A1L, #A1R, #A2L, #A2R on the panel. The size of the first convex portion #A1L, #A1R, #A2L, #A2R is half of that of the second convex portion #a1 to #a22, and the texture pattern of the first convex portion becomes the same size of the texture pattern of the second convex portion when combined with the corresponding texture pattern of the adjacent exterior panel. For example, the left upper first convex portion #A1L and the right upper first convex portion #A1R should be designed such that both the convex portions #A1L and #A1R exhibit a continuous texture pattern as if they were a single convex portion when arranged next to each other at the time of construction. Furthermore, these first convex portions #A1L, #A1R, #A2L, #A2R should be designed to have the same texture pattern among all of the exterior panels. In other words, even if the left upper first convex portion #A1L and the left lower first convex portion #A2L for example are not the same, when focusing on the left upper first convex portions #A1L for example, the left upper first convex portion should be designed to have the same texture pattern among all of the exterior panels. Accordingly, when focusing on only this portion, the texture patterns are arranged regularly. However, if the texture patterns of other second convex portions #a1 to #a22 are arranged randomly, all of the convex portions appear to be arranged randomly when the constructed exterior portion is observed as a whole.

As will be understood from the above, in designing texture patterns of convex portions of several exterior panels, initially, the texture pattern of the first convex portion which is common to all of the exterior panels is decided. Then, texture patterns are randomly allotted to the second convex portions on every exterior panel. Thus, in the exterior appearance of the exterior portion to which these exterior panels are applied, naturally continued surface designs can be obtained at the first convex portions of adjacent exterior panels, and it looks like as if texture patterns are randomly allotted to each convex portions as a whole.

FIG. 2 shows an embodiment of a single exterior panel designed with a building material design support system according to one embodiment of the present invention. In this embodiment, the exterior panel has a surface design pattern showing piled bricks of six rows. The first convex portions B1L, B2L, B3L, B1R, B2R, B3R are located at 6 (six) portions and common to all of exterior panels. In the second convex portions, texture patterns are randomly allotted every exterior panel. Accordingly, no exterior panel having the exact same texture pattern exists basically.

Figure 3:
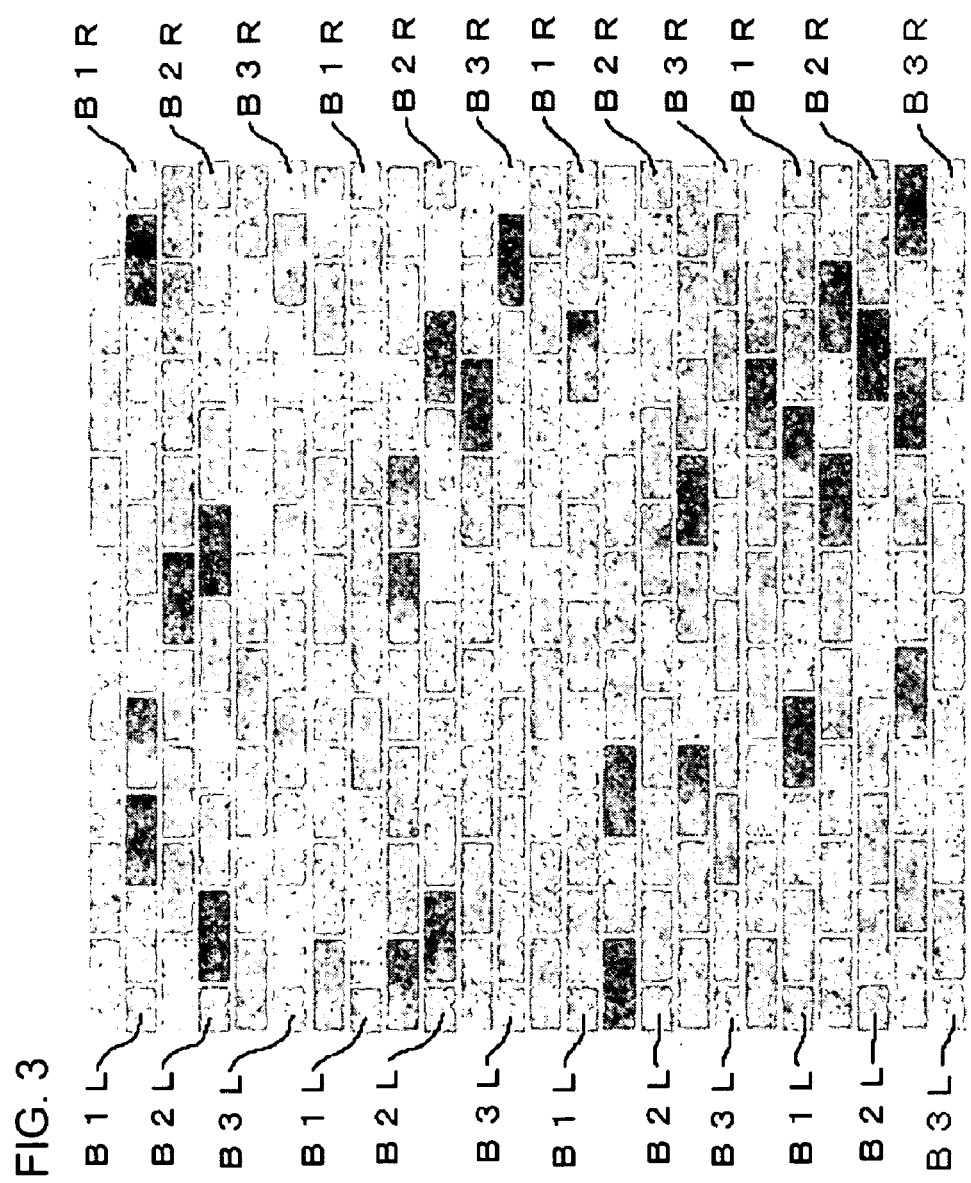
FIG. 3 is an example of an exterior panel arrangement simulated with a building material design support system according to an embodiment of the present invention.

FIG. 3 shows an example of an exterior panel arrangement simulated with a building material design support system according to an embodiment of the present invention. In this embodiment, a total of 4 (four) exterior panels are arranged in the up-and-down direction so that an assumed exterior appearance of the exterior portion can be considered in advance.

As will be understood from this embodiment, although the first convex portions (e.g., B1L) of the four exterior panels have the same texture pattern, since the texture patterns of the second convex portions are randomly arranged, it appears that texture patterns are randomly arranged as a whole. Furthermore, since the first convex portions have texture patterns common to all of the exterior panels, the texture patterns do not appear to be discontinued at the joint portions of the exterior panels.

Figure 4:
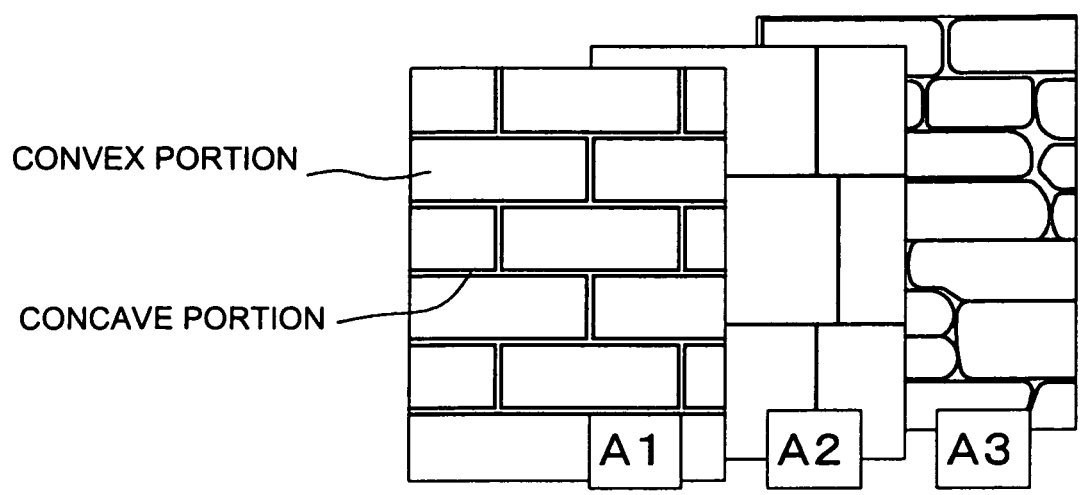
FIG. 4 shows examples of surface design patterns to be used in a building material design support system according to an embodiment of the present invention.

FIG. 4 shows examples of surface design patterns to be used in a building material design support system according to an embodiment of the present invention. In the case of ceramic series (cement series) exterior panels, for example, surface design patterns A1, A2, A3 in accordance with the number of molds are used. These surface design patterns are stored as convex portion partitioning image data (information on the width and the locations of concave portions).

In simulating an exterior panel, one surface design pattern is selected from plural stored surface design patterns.

Figure 5:
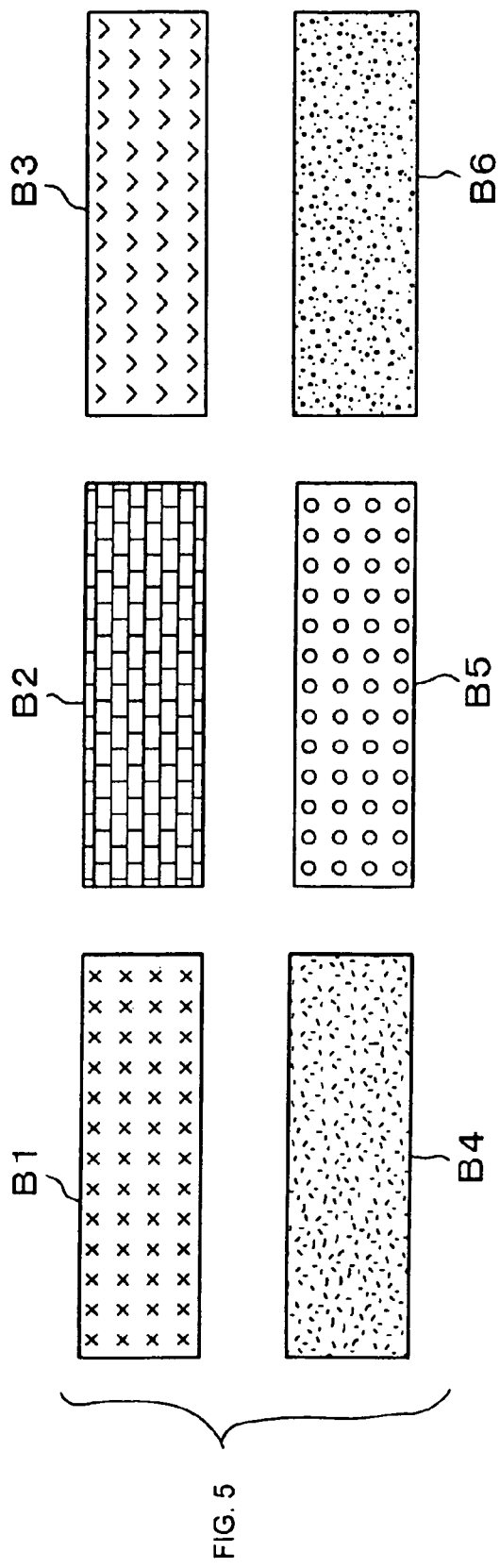
FIG. 5 shows examples of texture patterns to be used in a building material design support system according to an embodiment of the present invention.

FIG. 5 shows examples of texture patterns to be used in a building material design support system according to an embodiment of the present invention. The texture pattern is stored as image data B1, B2, B3, B4, B5, B6 including information on two attributes namely, a substrate appearance and particle expressing elements (size, shape and position information) dispersed in the substrate appearance.

Simulation of an exterior panel can be performed by selecting one texture pattern among stored texture pattern groups consisting of plural types of texture patterns of the same system and then pasting the selected texture pattern on convex portions.

Figure 6:
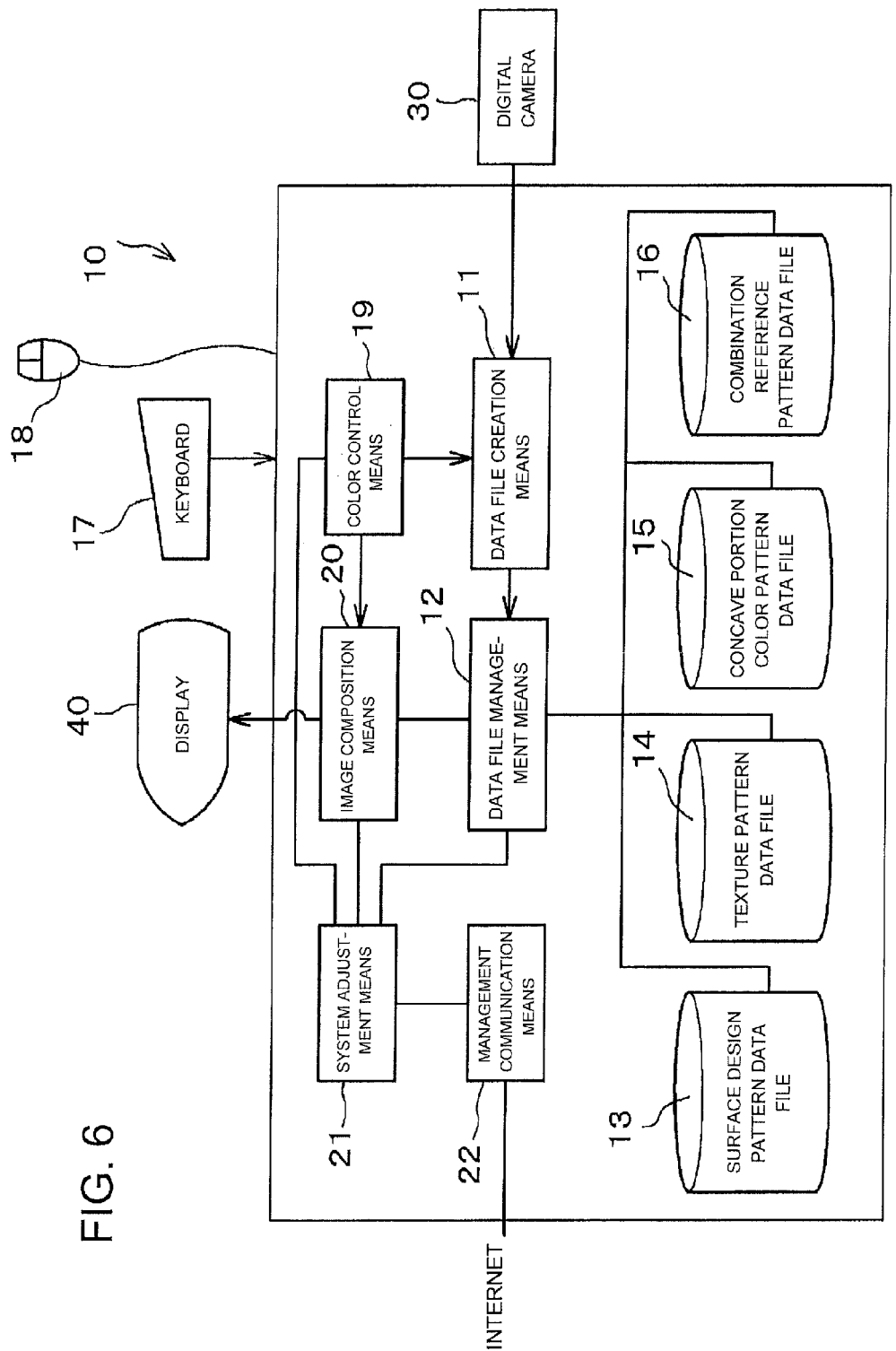
FIG. 6 shows a structure of a building material design support system according to an embodiment of the present invention.

FIG. 6 shows a structure of a building material design support system according to an embodiment of the present invention. This embodiment embodies such system as a client apparatus 10 to be installed at the client side. This client apparatus 10 is provided with a data file creation means 11, a data file management means 12, a surface design pattern data file 13, a texture pattern data file 14, a concave portion color pattern data file 15, a combination reference pattern data file 16, a keyboard 17, a mouse 18, a color control means 19, an image composition means 20, a system adjustment means 21, an order management communication meant 22 and a display 40.

The texture pattern data file 14 is configured to store several texture pattern groups including plural types of texture patterns of the same system. It should be understood that the wording of "the same system" mentioned above includes similar systems.

By loading images of design samples photographed with a digital camera 30, the data file creation means 11 creates pattern data for the surface design pattern data file 13, pattern data for the texture pattern data file 14, and pattern data for the concave portion color pattern data file 15. The data file management means 12 stores each pattern data in respective pattern data files, i.e., the surface design pattern data file 13, the texture pattern data file 14, and the concave portion color pattern data file 15. Other than the fundamental files required to combine the patterns, this apparatus 10 is provided with a combination reference pattern data file 16 for combination samples for the convenience (advices, tips) of users who design an exterior panel pattern. During the course of the exterior panel design, the image composition means 20 reads out each pattern data from the surface design pattern data file 13, the texture pattern data file 14, and the concave portion color pattern data file 15 in accordance with the user's selection and designation to compose an image. In composing the image, the color is adjusted with the color control means 19.

The image composition means 20 randomly reads out texture data from the selected texture pattern group in the texture pattern data file 14 and then allots the read texture data to each convex portion.

Now, the texture pattern creation operation in the image composition means 20 will be explained.

When a surface design pattern and a texture pattern group are selected by a user, the data file management means 12 selects a texture pattern group corresponding to the user selection from the texture pattern data file 14. Then, the data file management means 12 allots the texture pattern selected by the user among the selected texture pattern group to the first convex portions, and randomly reads out texture patterns from the texture pattern group and allots them to the second convex portions. Since texture patterns randomly selected from the texture pattern group are allotted to the second convex portions constituting the principle portion of the exterior panel, no two are ever the same basically. Thereafter, the data file management means 12 reads out each pattern data from the concave portion color pattern data file 15 and composes an image while executing the color control by the color control means 19.

After completion of the designing, the design information data is transmitted by order management communication means 22 to a server apparatus of a building manufacturer via the system adjustment means 21 for adjusting the entire system and the Internet.

Figure 7:
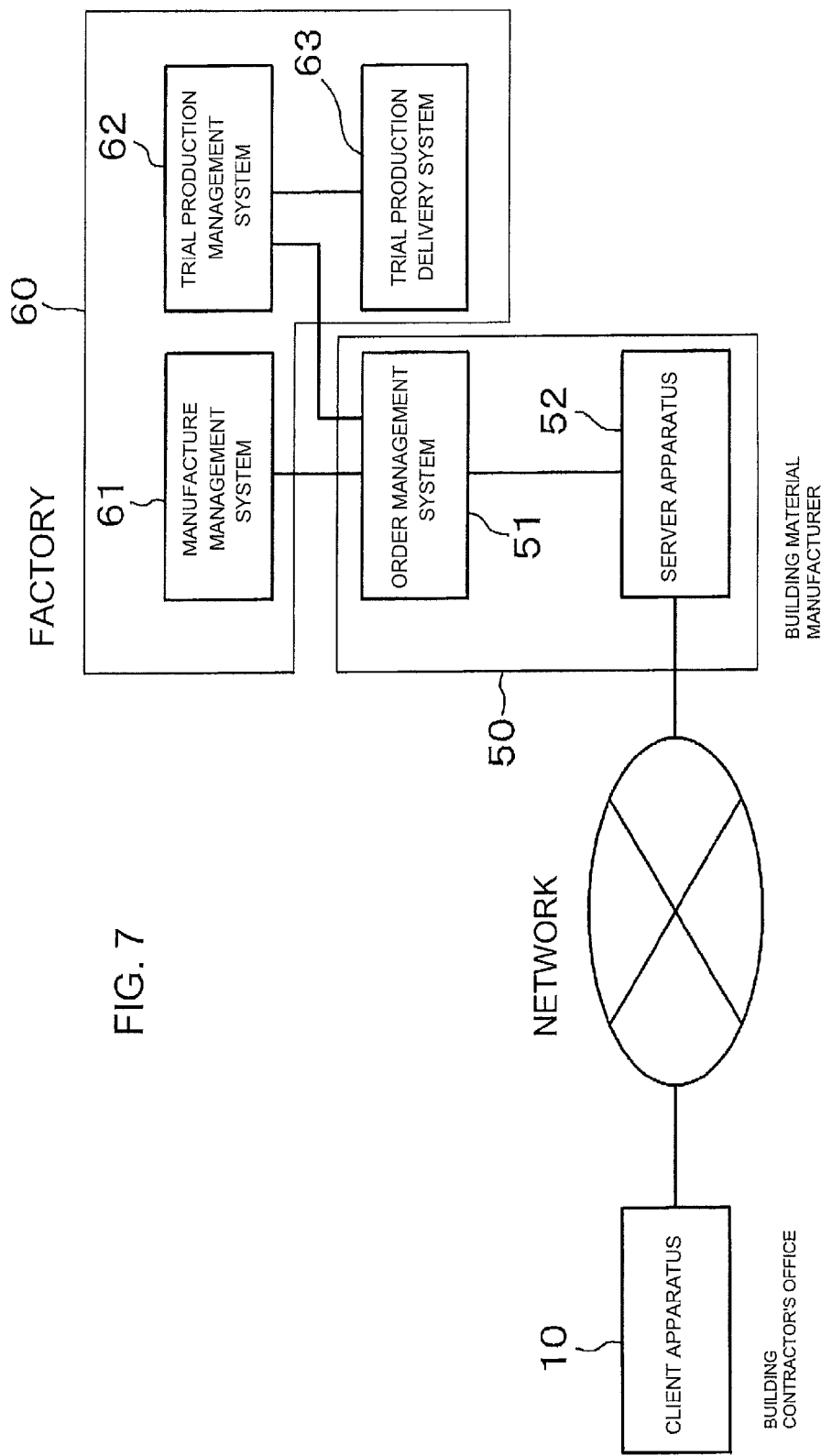
FIG. 7 shows a structure of a server-client operational system using a building material design support system according to an embodiment of the present invention.

FIG. 7 shows a structure of a server-client operational system using a building material design support system according to an embodiment of the present invention. When a trial production image information on the design created by a user by itself is transmitted from the client apparatus 10 installed in, e.g., a building contractor's office to a server apparatus 52 installed in, e.g., a building material manufacturer's office, an order management system 51 transmits the design directly to a manufacture management system 61 in the factory 60 if the communication is directed to an order of exterior panels of the design, or transmits the design to a trial production management system 62 if the communication is directed to a trial production order of the design. The manufacture management system 61 manufactures and administrates the exterior panel of the received design. The trial production management system 62 manufactures exterior panels of the received design by way of trial, and a trial production delivery system 63 transmits the digital picture data of the trial product to a user. In place of transmitting the data, the actual trial product can be delivered to the user. Since such design ordered to produce experimentally or manufacture via the aforementioned system can be obtained from a client, assuredness can be given to decision-making in ordering.

Figure 8:
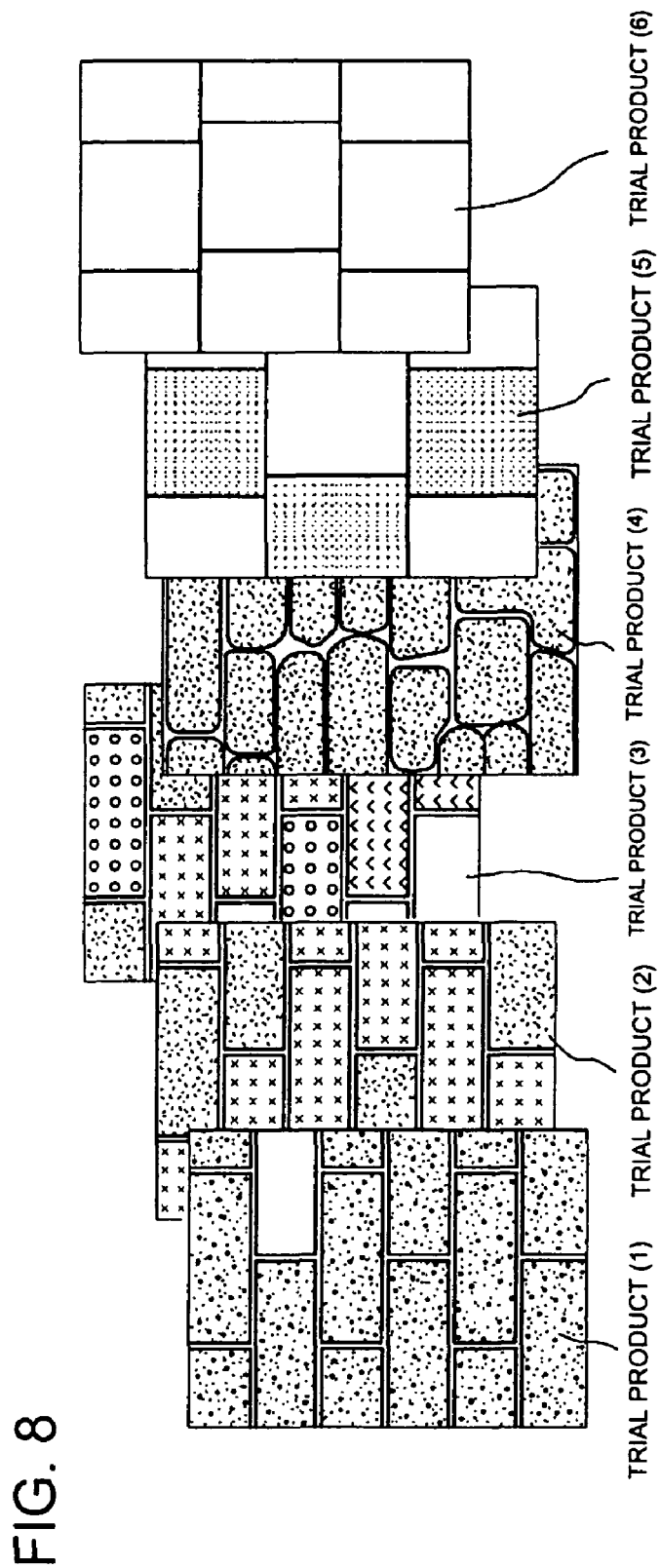
FIG. 8 shows examples of trial production data designed with a building material design support system according to an embodiment of the present invention.

FIG. 8 shows examples of trial production result data designed with a building material design support system according to an embodiment of the present invention. The trial product delivery system 63 transmits the digital picture data of these trial products to a client.

Figure 9:
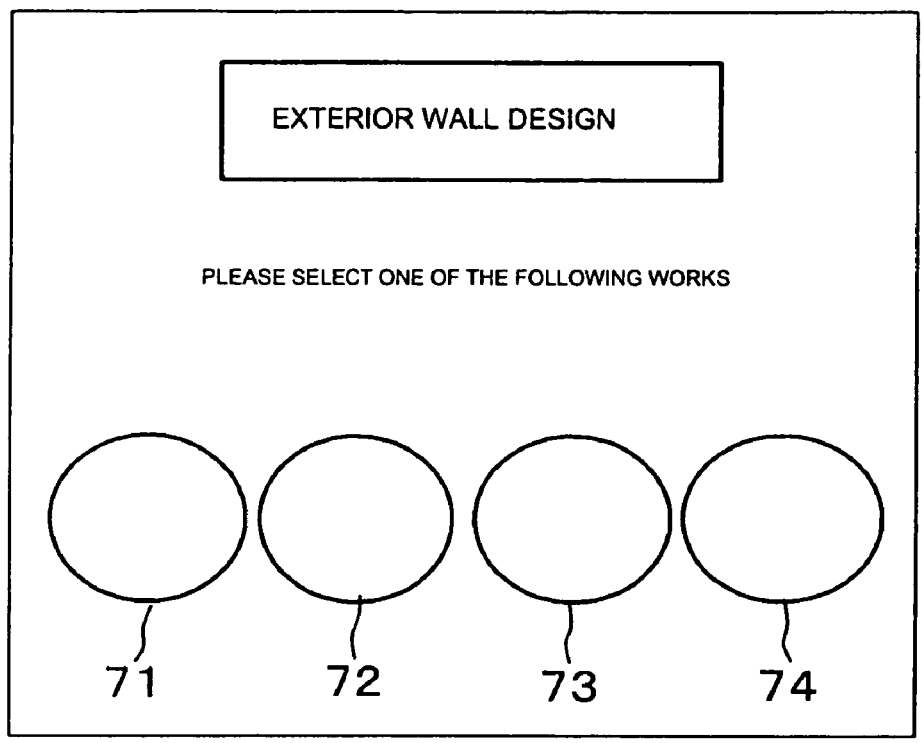
FIG. 9 shows an example of a work menu selection screen in a building material design support system according to an embodiment of the present invention.

FIG. 9 shows an example of a work menu selection screen in a building material design support system according to an embodiment of the present invention. This work menu selection screen includes a surface design pattern button 71 to proceed to the surface design pattern selection work, a texture pattern button 72 to proceed to the texture pattern group selection work, a concave portion color button 73 to proceed to the concave portion color pattern selection work and a communication screen proceeding button 74 to proceed to a work for transmitting the completed design to a server apparatus 52 of a building material manufacturer 50.

Figure 10:
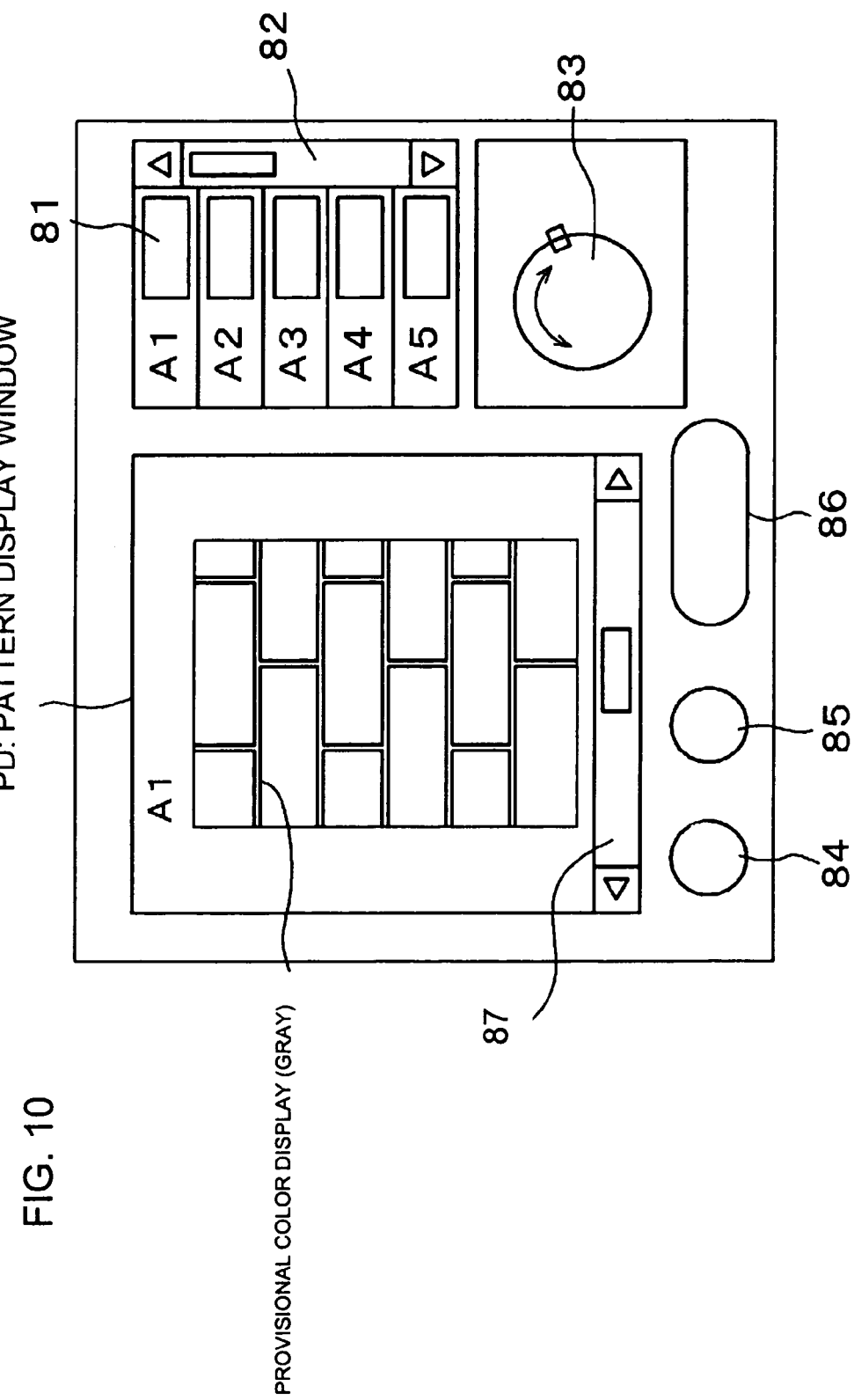
FIG. 10 shows an example of a surface design pattern selection screen in a building material design support system according to an embodiment of the present invention.

FIG. 10 shows an example of a surface design pattern selection screen in a building material design support system according to an embodiment of the present invention. This surface design pattern selection screen includes a pattern display window PD, a sample selection button 81, a scroll bar 82, a jog dial 83, a display button 84, a decision button 85, a work selection screen returning button 86, and a scroll bar 87. By clicking the display button 84 after selecting one of the sample selection buttons 81 while scrolling the sample selection buttons 81 using the scroll bar 82, a surface design pattern of an exterior panel is displayed in the pattern display window PD. This display can be scrolled using the scroll bar 87. The jog dial 83 enables color adjustment of the displayed surface design pattern. As to the concave portion, a provisional color such as a gray color is displayed. If the user is satisfied with this surface design pattern, the decision button 85 is clicked to fix the pattern, and the work selection screen returning button 86 is clicked to return to the work selection screen.

Figure 11:
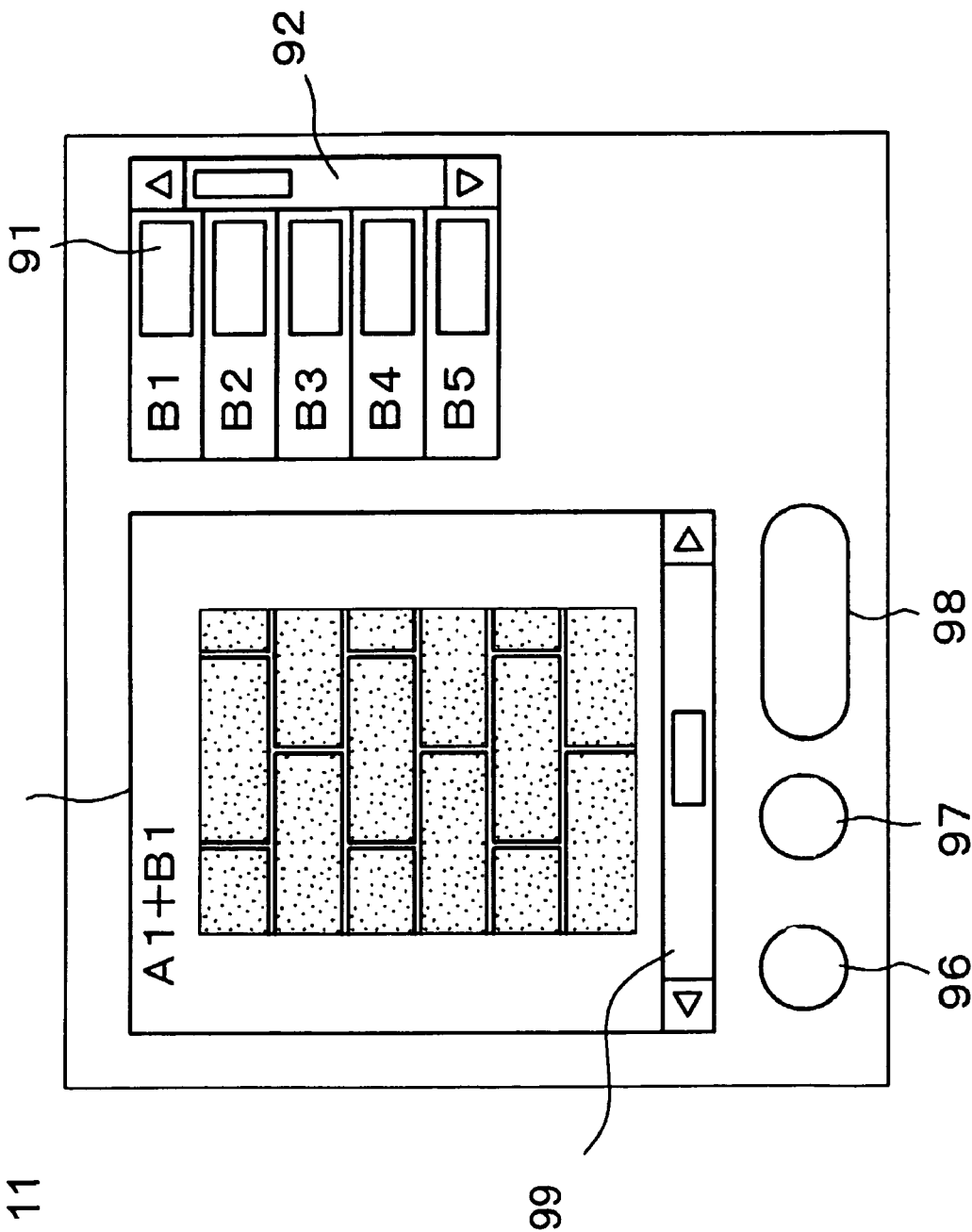
FIG. 11 shows an example of a texture pattern group selection screen in a building material design support system according to an embodiment of the present invention.

FIG. 11 shows an example of a texture pattern group selection screen in a building material design support system according to an embodiment of the present invention. This texture pattern group selection screen includes a pattern display window PD, a texture pattern group selection button 91, a scroll bar 92, a display button 96, a decision button 97, a work selection screen returning button 98, and a scroll bar 99. By clicking the display button 96 after selecting one of the texture pattern group selection buttons 91 while scrolling the texture pattern group selection buttons 91 using the scroll bar 92, a composite image in which a prescribed texture pattern data is allotted to the first convex portions of the surface design pattern A1 and each texture pattern data of the texture pattern group B1 is randomly allotted to the second convex portions is displayed in the pattern display window PD. This display can be scrolled using the scroll bar 99. If the user is satisfied with this surface design pattern and the texture pattern, the decision button 97 is clicked to fix the surface design pattern and the texture pattern, and the work selection screen returning button 98 is clicked to return to the work selection screen.

Figure 12:
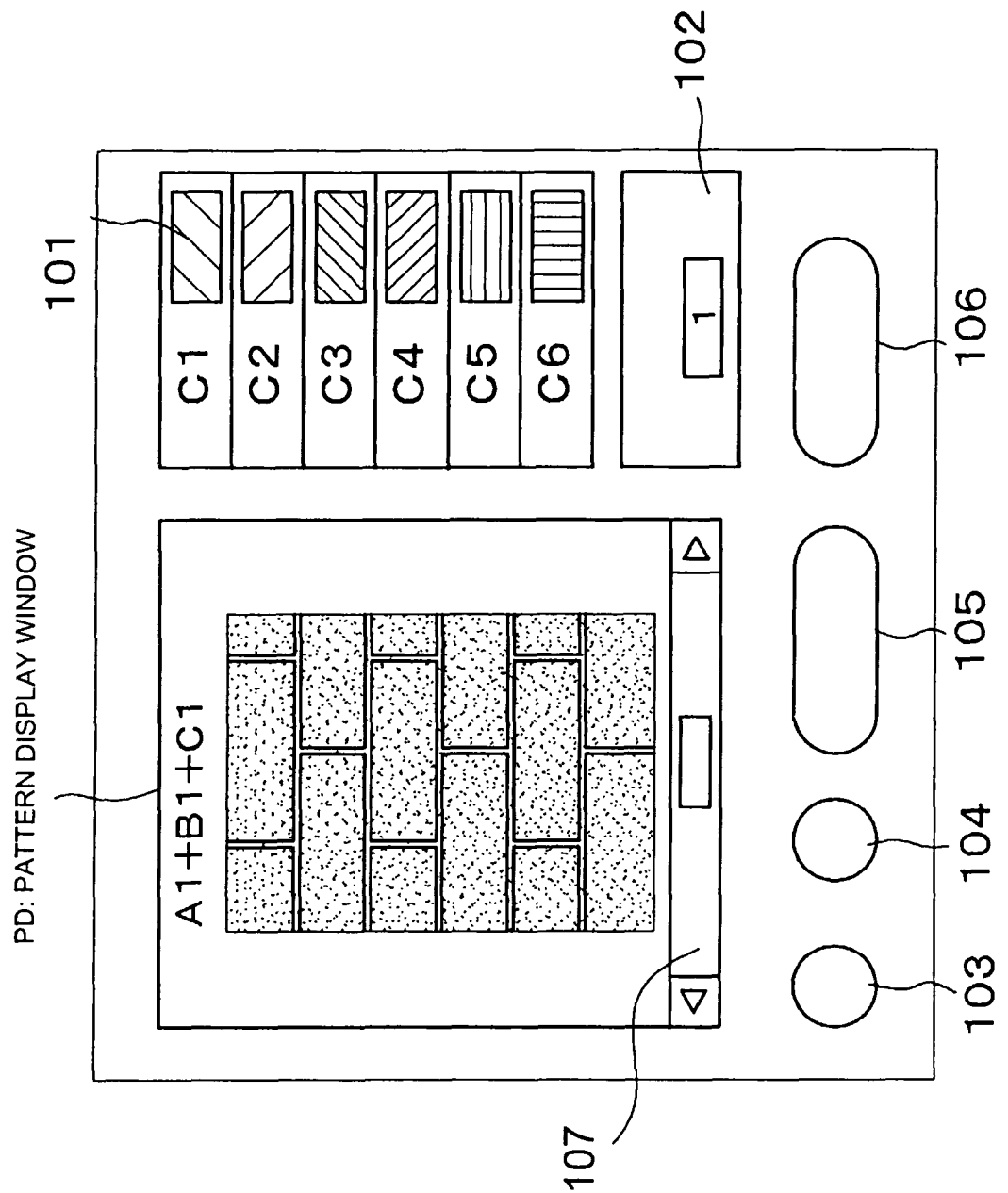
FIG. 12 shows an example of a concave portion color pattern selection screen in a building material design support system according to an embodiment of the present invention.

FIG. 12 shows an example of a concave portion color pattern selection screen in a building material design support system according to an embodiment of the present invention. This concave portion color pattern selection screen includes a pattern display window PD, a sample selection button 101, a desired trial production number inputting portion 102, a display button 103, a decision button 104, a surface design pattern selection screen returning button 105, a work selection screen returning button 106, and a scroll bar 107. By clicking the display button 103 after selecting one of the sample selection buttons 101 and then inputting a desired trial production number, a composite image in which, for example, the surface design pattern A1, the convex portion texture pattern B1 and the concave portion color pattern C1 are selected is displayed in the pattern display window PD. This display can be scrolled using the scroll bar 107. If the user is satisfied with this surface design pattern, the convex portion texture pattern and the concave portion color pattern, the decision button 104 is clicked to fix them, and the surface design pattern selection screen returning button 105 is clicked to return to the next design, or the work selection screen returning button 106 is clicked to return to the work selection screen.

Figure 13:
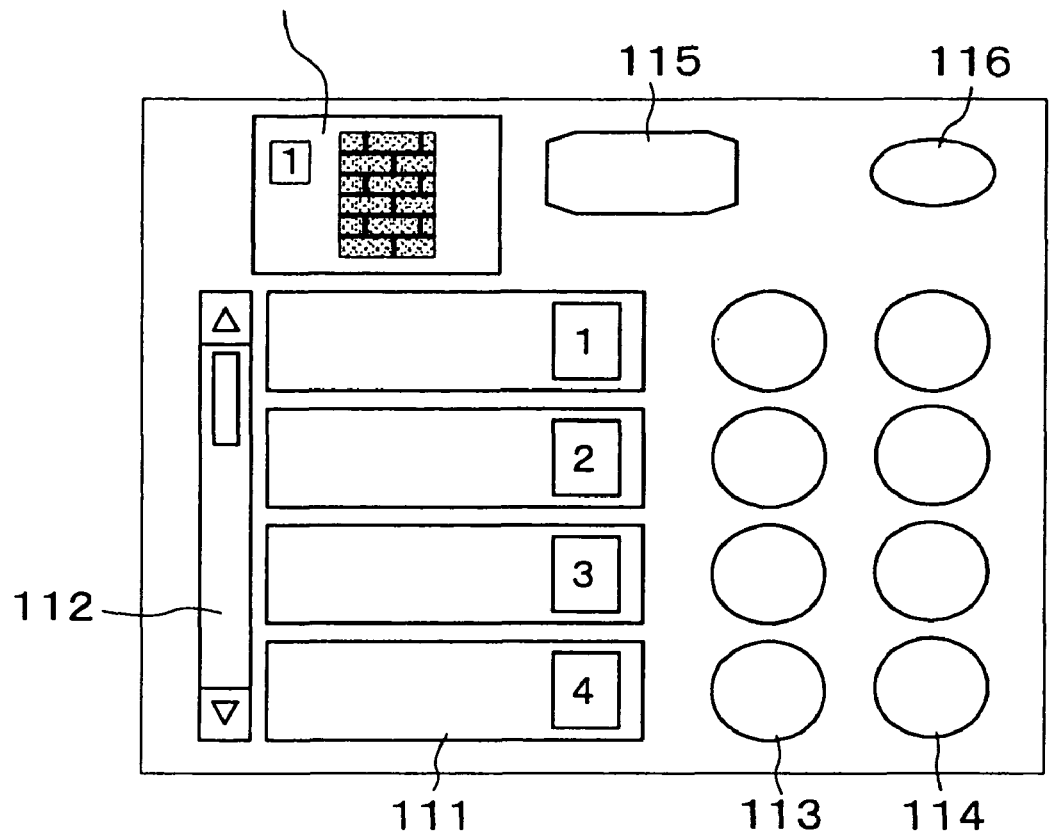
FIG. 13 shows an example of a communication screen in a building material design support system according to an embodiment of the present invention.

FIG. 13 shows an example of a communication screen in a building material design support system according to an embodiment of the present invention. This communication screen includes a trial sample image displaying window SD, a desired trial production number displaying portions 111, a scroll bar 112, trial production order buttons 113, order buttons 114, a communication button 115, and an end button 116. After selecting one of the desired trial production numbers while scrolling using the scroll bar 112 and confirming the sample displayed in the trial sample image display window SD, a trial production is ordered by clicking the trial production order button 113, or an order is executed by clicking the order button 114. In actual, a communication is initiated by clicking the communication button 115. After completion of the work, the program is terminated by clicking the end button 116.

The present invention is not limited to the aforementioned embodiment.

The building material design support system according to the present invention can be realized by a program for making a computer function as this building material design support system. This program can be stored in a computer readable recording medium.

The recording medium storing the program can be a ROM of the client apparatus 10 as shown in FIG. 6. Alternatively, the recording medium can be a CD-ROM to be inserted in a program reading device such as a CD-ROM drive of an external memory storage.

Furthermore, the recording medium can be an electromagnetic tape, a cassette tape, a flexible disk, a hard disk, MO/MD/DVD, etc., or a semiconductor memory.

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" is meant as a non-specific, general reference and may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure and during the prosecution of this case, the following abbreviated terminology may be employed: "e.g." which means "for example;" and "NB" which means "note well."

What is claimed is:

1. A building material design support system for supporting design of a surface pattern of a building material including island-shaped convex portions and concave portions connecting the adjacent convex portions, the convex portions including first convex portions to be arranged next to corresponding first convex portions of the adjacent building material and second convex portions larger than the first convex portions and each surrounded by the concave portions, the building material design support system comprising:

a computer with a recording medium for data files, the computer being able to function as the building material design support system;

a surface design pattern data file configured to store surface design pattern data on arrangements of the convex portions and the concave portions;

a texture pattern data file configured to store texture pattern groups including plural texture patterns of the same system, the texture pattern representing the feel of a material of the convex portion;

surface design pattern selection means for selectively reading out one of the surface design pattern data stored in the surface design pattern data file;

texture pattern group selection means for selectively reading out one of the texture pattern groups stored in the texture pattern data file;

image composition means for allotting a prescribed texture pattern common to all of building materials among a texture pattern group selectively read out with the texture pattern group selection means to the first convex portions of the surface design pattern selectively read out with the surface design pattern selection means and for randomly allotting texture patterns from the texture pattern group to the second convex portions adjacent to the first convex portions; and display means for displaying a surface design to which the texture patterns are allotted to the surface design pattern by the image composition means.

* * * * *